United States Patent [19]
Dalton et al.

[11] Patent Number: 5,788,869
[45] Date of Patent: Aug. 4, 1998

[54] METHODOLOGY FOR IN SITU ETCH STOP DETECTION AND CONTROL OF PLASMA ETCHING PROCESS AND DEVICE DESIGN TO MINIMIZE PROCESS CHAMBER CONTAMINATION

[75] Inventors: Timothy J. Dalton, North Reading; Ann C. Westerheim, Westford; Jamshed Hoshang Dubash; Marion Garver, both of Marlboro; Richard A. Bickford, Boylston, all of Mass.

[73] Assignee: Digital Equipment Corporation, Maynard, Mass.

[21] Appl. No.: 552,322

[22] Filed: Nov. 2, 1995

[51] Int. Cl.⁶ .................................... H01L 21/66
[52] U.S. Cl. ............... 216/60; 134/1.1; 438/9; 438/16; 438/905; 204/192.13; 204/298.32; 156/345 MT
[58] Field of Search .................. 156/626.1, 643.1, 156/345; 216/59, 60; 204/192.13, 298.32; 438/9, 16, 905; 134/1.1

[56] References Cited

U.S. PATENT DOCUMENTS

| | | | |
|---|---|---|---|
| 4,289,188 | 9/1981 | Mizutani et al. | 216/60 |
| 4,457,820 | 7/1984 | Bergeron et al. | 156/626.1 |
| 4,857,136 | 8/1989 | Zajac | 156/626.1 |
| 4,888,199 | 12/1989 | Felts et al. | 204/192.13 |
| 5,290,383 | 3/1994 | Koshimizu | 216/60 |
| 5,320,704 | 6/1994 | Horioka et al. | 156/626.1 |
| 5,348,614 | 9/1994 | Jerbic | 156/626.1 |
| 5,374,327 | 12/1994 | Imahashi et al. | 156/626.1 |
| 5,458,732 | 10/1995 | Butler et al. | 216/61 |

FOREIGN PATENT DOCUMENTS 06-081175 A  3/1994  Japan.

OTHER PUBLICATIONS

Guinn, K. et al. J. Vac. Sci. Tech. A "Optical emission diagnostics for contact etching in Applied Materials Centura HDP 5300 etcher" vol. 14, #3, pp. 1137–1141, May 1996.

Harshbarger, W.R. et al. J Electronic Mat. "Optical Detector to monitor plasma etching" vol. 7, #3, pp. 429–440, May 1978.

Abstract of "Optical Emission Diagnostics for Contact Etching on the Applied Materials Centura HDP 5300 Dielectric Etcher," K.V. Guinn, K. Tokashiki, 42nd National Symposium, Oct. 16–20, 1995, p. 171.

Abstract of "The Chemical Challenge of Submicron Oxide Etching," S.C. McNevin, K.V. Guinn, J. Ashley Taylor, 42nd National Symposium, Oct. 16–20, 1995, p. 315.

Primary Examiner—R. Bruce Breneman
Assistant Examiner—Anita Alanko
Attorney, Agent, or Firm—Christopher J. Cianciolo

[57] ABSTRACT

A method of etching a dielectric layer to form a via to an underlying conductive layer is described. The method includes etching selected portions of the dielectric using a plasma containing an etchant and monitoring electromagnetic energy of plasma emission radiation from the species to determine a ratio of a pair of the species in the plasma that is used to indicate the onset of an etch stop phenomenon. Etching of the dielectric continues and additional dielectrics are processed through the plasma etching step while the ratio of species is less than a predetermined threshold value. The process is stopped and a plasma reactor is cleaned once the ratio of the etchants exceeds the threshold value. The method can be used to form vias between a pair of conductive layers. In a preferred approach to form areas for area or bond pads of an integrated circuit during the step of etching the dielectric, the dielectric is masked by a pattern which provides a plurality of vias dispersed within the pad area to be etched forming a sea of contacts or disposed about the periphery of the pad area to be etched forming a ring of contacts contact.

19 Claims, 4 Drawing Sheets

5,788,869

METHODOLOGY FOR IN SITU ETCH STOP DETECTION AND CONTROL OF PLASMA ETCHING PROCESS AND DEVICE DESIGN TO MINIMIZE PROCESS CHAMBER CONTAMINATION

BACKGROUND OF THE INVENTION

This invention relates generally to semiconductor fabrication and more particularly to plasma etching used in semiconductor fabrication.

As it is known in the art, during the course of manufacture of semiconductor devices, it is often necessary to etch dielectric and/or metal layers to provide features in the layers for subsequent semiconductor processing steps. One such etching technique employed in semiconductor manufacturing is so-called plasma discharge etching in which a surface to be etched is placed in contact with a plasma typically contained within a reactor vessel. The surface to be etched is exposed to the plasma and components of the plasma selectively remove portions of the surface. Plasma discharge etch is typically used when highly directive etching features are desired.

One such use of a plasma etch is in the formation of vias or holes through a dielectric to interconnect different conductive layers such as a semiconductor or metal on a semiconductor circuit. Also such vias are used in the formation of pads which are typically used to interconnect, for example, wire bonds to an integrated circuit.

It is commonly known that a plasma discharge etching process can be monitored by the use of optical techniques. Typically, in the optical techniques, a portion of the electromagnetic energy contained in the plasma is monitored via some optical arrangement to provide an indication of the end of an etching process. For example as discussed in U.S. Pat. No. 4,312,732 Mars the optical energy of the plasma can be used to determine when etching of a specific material is completed. For example the patent describes using the process to determine when a photoresist has been completely removed from a surface of a solid state device.

In a typical fabrication of a modern semiconductor device, a conductive layer is deposited and patterned over a semiconductor surface. Then a layer of dielectric, such as silicon dioxide is deposited over the patterned conductive layer. Typically, the silicon dioxide is planarized to provide a flat surface. The planarized dielectric is then patterned to form vias. The vias are filled with a conductive material such that another layer of conductive material can be deposited over the vias and dielectric to provide an upper conductive pattern. Subsequent conductive layers are deposited over corresponding dielectric material layers which are provided with corresponding vias to form an interconnect pattern for an integrated circuit.

Generally, on the periphery of such integrated circuits, very large areas are etched in the silicon dioxide to form bond pads, for example. The etch process used to etch the dielectric to provide the vias as well as the bond pad areas for the semiconductor device is generally the aforementioned plasma discharge technique.

One problem that has been seen during manufacture of bond pads, vias, and the like using plasma etching techniques is the phenomena called "etch stop". Etch stop can be viewed as the inability to completely form a via. That is, under certain circumstances, the etching progresses for a certain distance into the dielectric material and then due to conditions not completely understood, the dielectric material stops etching. Continuing the etch process past the etch-stop point does not result in the contact via etching pattern being etched further into the dielectric material. When this occurs, the material and work in progress is generally spoiled and must be discarded.

Another problem with etch-stop, it that it is generally very difficult to detect particularly in a manufacturing line, and thus, it is not often known whether or not etch-stop has occurred during the manufacturing process. Often therefore, a complete run of a number of wafers in which the etch-stop phenomena has occurred are completed only to find out that the contact via patterns were not completely etched into the dielectric on all of the wafers.

There is a known, albeit inadequate way to determine whether or not etch-stop has occurred. One approach is to physically observe a portion of a wafer cross section by using a scanning electronic microscope. There are practical problems with this technique. One problem is that the technique is a destructive technique. Further, it is a time-consuming process which is not desirable to be performed in a manufacturing line because of particle contamination, time considerations and expense.

However, if etch-stop occurs and is not quickly detected, a large number of wafers may be processed and each of the wafers will have the remnants of the etch-stop problem, that is, incompletely etched vias.

SUMMARY OF THE INVENTION

In accordance with the present invention, a method of etching a dielectric layer to form a via to an underlying conductive layer includes the steps of etching selected portions of the dielectric using a plasma containing an etchant and monitoring electromagnetic energy in the plasma disposed about the dielectric to determine a ratio of a pair of specie components in the plasma. The method also includes the step of continuing to etch the dielectric and to process additional dielectric layers through the plasma etching step while the ratio of specie components is less than a predetermined threshold value; and stopping etching of subsequent dielectrics when the ratio of the specie components exceeds the threshold value. With such an arrangement, monitoring of the species of the plasma to determine when a threshold is approached or exceeded provides a technique which can be used to avoid the onset of the etch-stop phenomena. This can also be used to verify that the etch-stop phenomena has not occurred during the etching process. It gives an indication of when remedial measures are necessary to prevent the onset of etch-stop.

In accordance with a further aspect of the present invention, the dielectric is etched to form areas for contact pads of an integrated circuit and during the step of etching the selected portions, the dielectric is masked by a pattern which provides a plurality of vias disposed about the periphery of the pad area to be etched. With such an arrangement, by employing a ring of contacts or a sea-of-contacts masking pattern the pattern minimizes the area to be etched through the dielectric layer and provides concomitant advantages in avoiding the etch-stop phenomenon. That is, chamber poisoning which is believed to occur during etching of the dielectric material due principally to the unwanted etching of the underlying conductive layers is minimized and monitored. By monitoring the ratio of plasma species and not permitting the ratio to exceed the threshold value for the particular detector and emission line pair, the etch-stop phenomena can be generally avoided. Further, by employing the sea of contacts or ring of contacts approach, the amount of the dielectric that needs to be etched is minimized which concomitantly minimizes the amount of the underlying conductive layer that is exposed to the plasma and thus reduces the resulting contamination of the plasma.

BRIEF DESCRIPTION OF THE DRAWINGS

The foregoing features and other aspects of the present invention are now becoming apparent when viewed with the accompanying drawings taken in conjunction with the accompanying description in which.

DESCRIPTION OF THE PREFERRED EMBODIMENT

Figure 1:
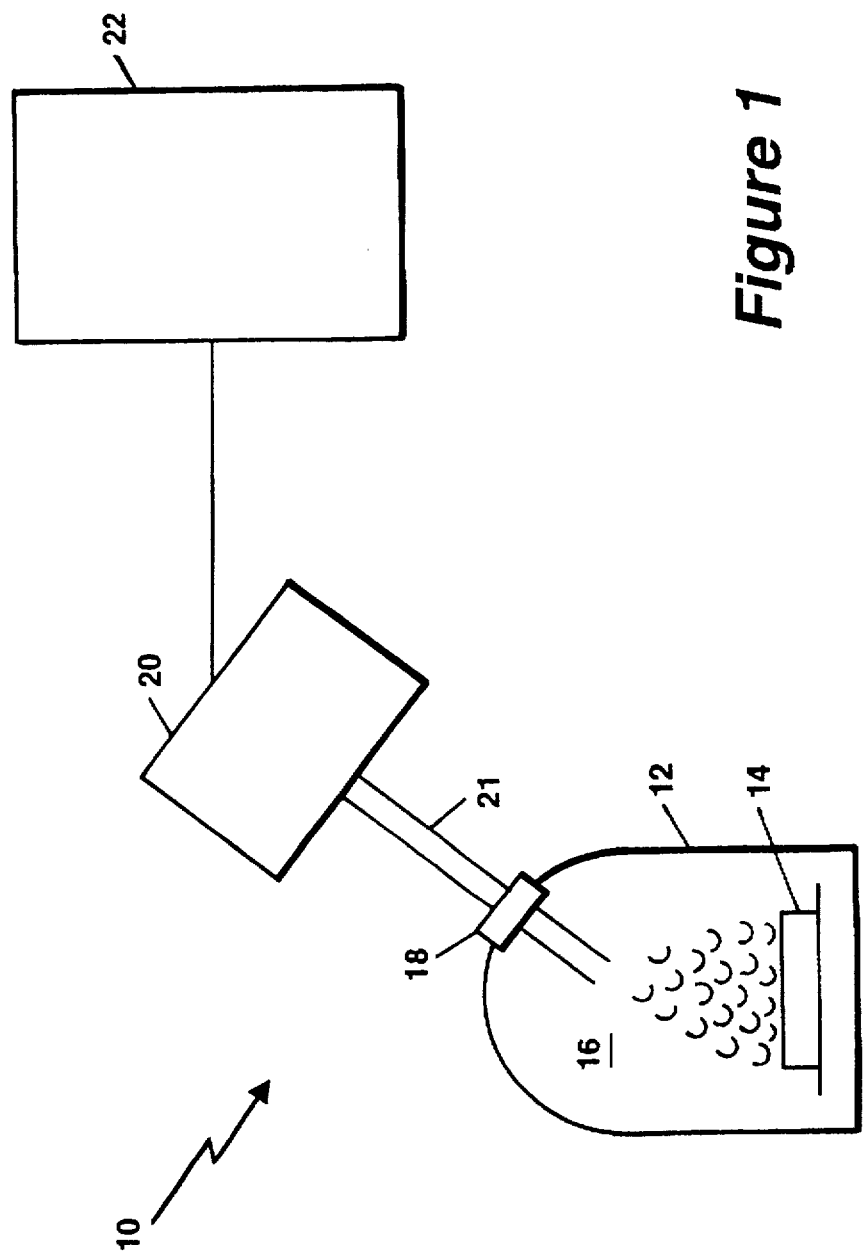
FIG. 1 is a schematic representation of a plasma etching system having an optical plasma etching monitor.

Referring now to FIG. 1, a plasma etching apparatus 10 is shown to include a chamber 12 which contains a wafer 14 which is undergoing an etching process as will be described via a plasma 16 contained within the reactor vessel 12. The reactor vessel 12 has an electromagnetic window 18 and the apparatus 10 further includes a detector 20. The window 18 is used to couple electromagnetic energy from plasma 16 to the detector 20. The detector 20 detects electromagnetic energy 21 in the plasma 16 to determine a ratio of energies of selected species in the plasma 16. The ratio of energies (hereinafter ratio) of the species of the plasma 16 is used to make determinations regarding the quality of the conditions within the plasma in reactor vessel 12 and thus to infer from those conditions whether the phenomena of etch-stop has occurred or is imminent.

The detector 20 is coupled to a data analyzer 22 which can produce graphs or charts or an average value of the ratio. These data are compared to the threshold to determine when the process has approached or is about to approach etch stop. Preferrably a number of samples of ratios of components in the plasma at different emission lines and different conditions are run to determine optimum threshhold values for a particular setup.

Figure 2:
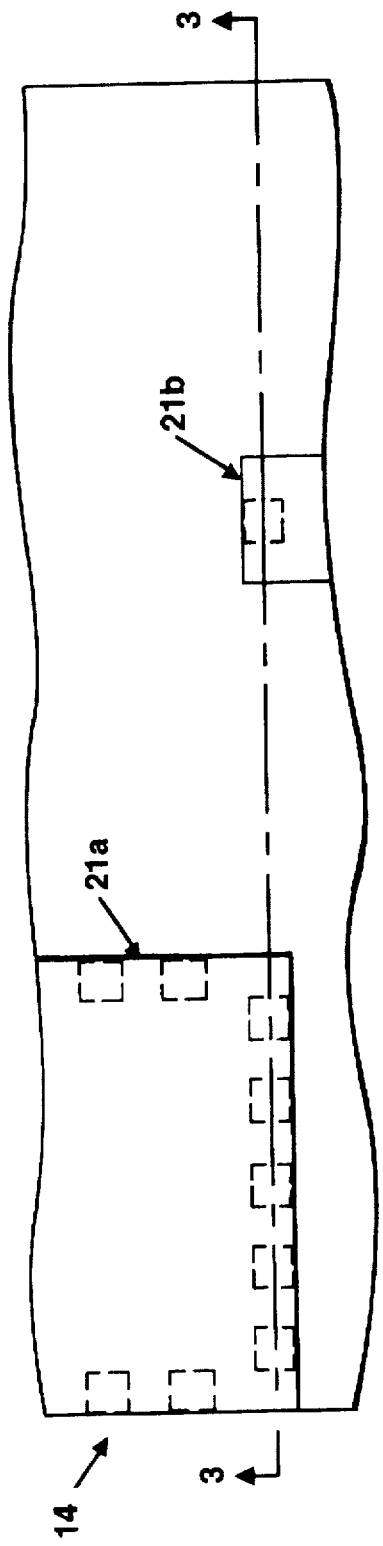
FIG. 2 is a plan view of a portion of an integrated circuit showing a bond pattern, a contact in accordance with one aspect of the present invention.
Figure 3:
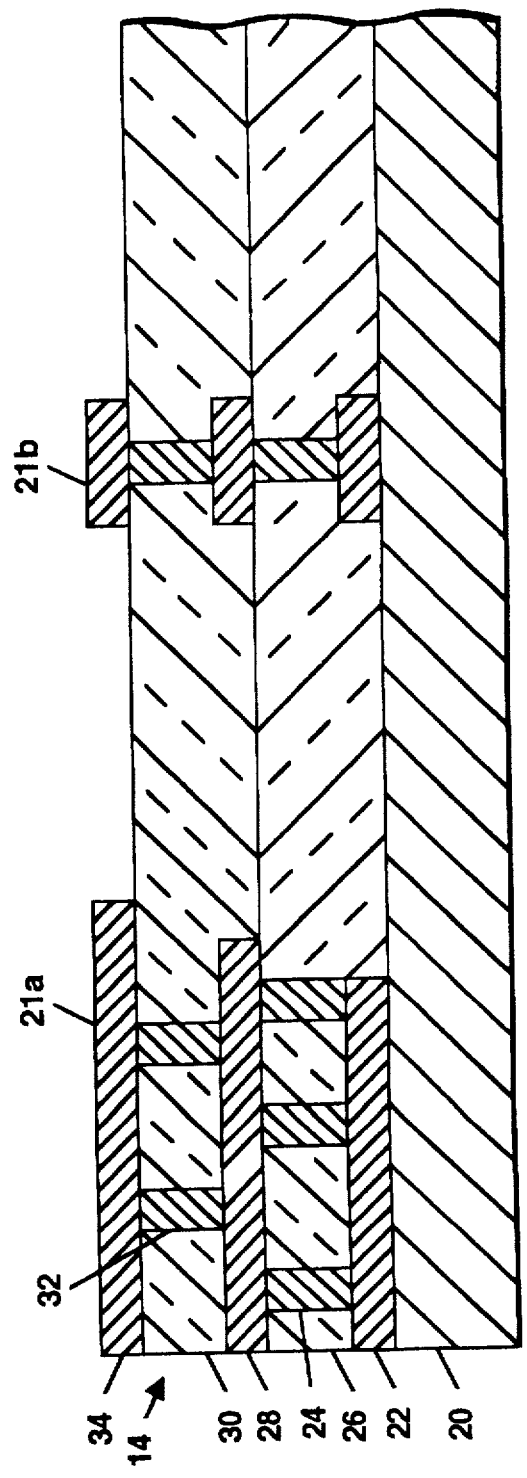
FIG. 3 is a cross-sectional view taken along line 33 of FIG. 2.

Referring now to FIGS. 2 and 3, a portion of the wafer 14 is shown to include a bond pad area 21a which is used, for example, to connect a wire bond from an integrated circuit formed in the wafer 14 to a semiconductor package (not shown) as well as a conductor contact 21b as shown. As shown more clearly in FIG. 3, the bond pad area 21a and the conductor 21b are formed by three conductive layers comprising patterned layers 22, 28 and 34 having disposed therebetween patterned dielectric layers 26 and 30. Here the layers are comprised of a conductive system such as TiN or Al. Alternatively a layer can be a semiconductor layer such as polysilicon or silicon. The dielectric 26 and 30 are patterned to form vias which are holes which are filled with a conductive material to form conductive via contacts generally 24 and 32 between a pair of conductive layers.

The bond pad area 21a is formed out of a "sea-of-contacts" which here comprises forming a plurality of vias within the area of the pad 21a to interconnect the pad to the layers 28 and 22 as shown. The sea-of-contacts minimizes the area to be etched through the dielectric layers 26 and 30 and provides concomitant advantages in avoiding the etch-stop phenomenon.

Figure 4:
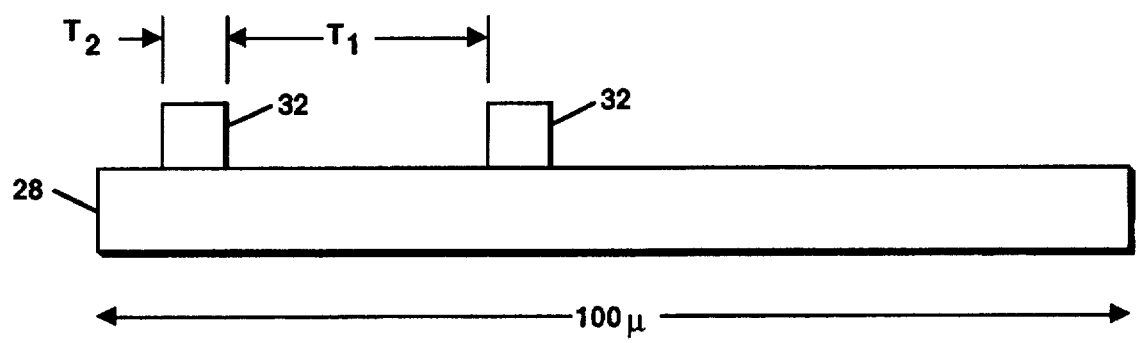
FIG. 4 is a cross-sectional view showing a furthered detailed relationship of a portion of FIG. 3.

In particular, as shown in FIG. 4, the sea-of-contact approach provides vias illustratively 32 which are spaced a typical distance of $T_1$ here corresponding to 4 to 6 critical design units (cdu) where a cdu is dependant on the technology. Thus for a 0.5 micron technology the spacing would be 2.0 to 3.0 microns. The vias have a length of approximately 1 to 2 cdu's. In general, the area has a defined side length for the contact 21a on the order of one hundred microns (100μ) with 60 to 120 microns being a typical range. By providing the small dispersed vias through the dielectric layer 30, the amount of area etched to form the bond pad area 21a is substantially reduced. A ring of contacts, where there are vias along the periphery, can alternatively be used.

Both the sea-of-contacts approach to provide connection for the contact pads and monitoring of the species of the plasma to determine when a threshold is approached or exceeded provides a technique which can be used to retard the onset of the etch-stop phenomena.

The latter can also be used to verify that the etch-stop phenomena has not occurred during the etching process. It gives an indication of when remedial measures are necessary, as will be further described in conjunction with FIG. 5, to prevent the onset of etch-stop.

Figure 5:
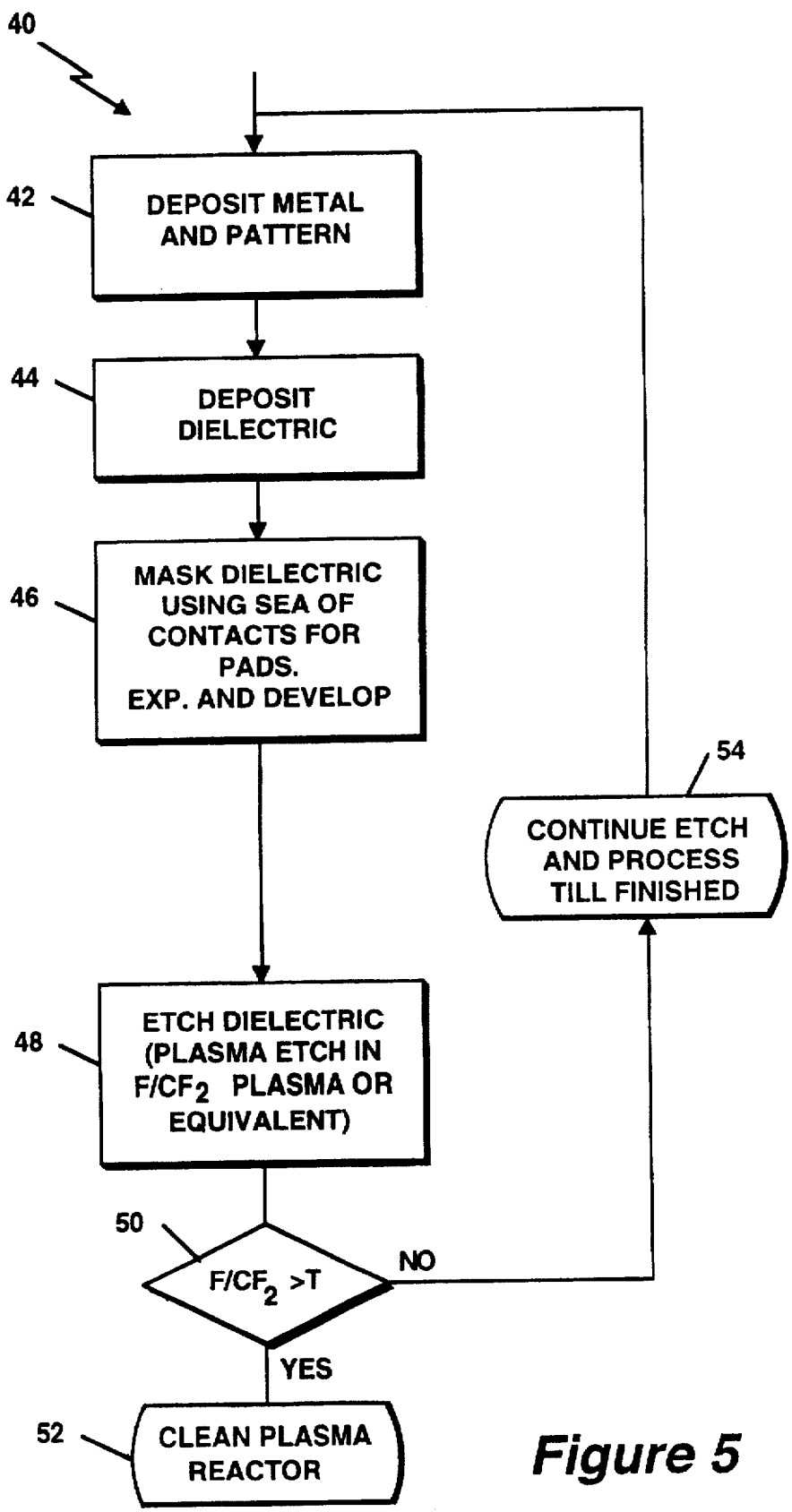
FIG. 5 is a flow chart showing the steps in fabricating a interconnect pattern using an etching monitor in accordance with the present invention.

Referring now to FIG. 5, a flow of steps used to provide the conductive layers generally shown in FIG. 3, includes a first step 42 of depositing a layer of metal or of conductive silicon or polysilicon and patterning the layer to provide a desired patterned conductor. After the conductive layer has been deposited and patterned, a layer of dielectric is deposited thereover. The dielectric is planarized, if necessary, to form a uniform surface over which subsequent metal or other conductive layers can be deposited. The dielectric is then masked using a mask which contains a sea-of-contacts pattern for large areas such as bonding pad areas and a normal pattern for other areas, such via contacts as where a via will be formed between a pair of metal interconnects. After the dielectric has been masked, the masking material such as a resist disposed on the dielectric is exposed and developed as in step 46.

After the resist of the masking material has been exposed and developed, the underlying dielectric is etched (step 48) using a plasma etching apparatus having a suitable etching species. A preferred etching species or etchant is a fluorine ion and/or radical containing plasma. In general a fluorinated hydrocarbon such as $C_2F_6$ is used as the source of the etchant. In the plasma many resulting species components are produced including $C_xF_y$ species. In addition other specie components are produced in the plasma from other materials present in the chamber including the chamber walls, the resist on the semiconductor etc. A ratio of selected ones of the resulting species components is monitored to ascertain conditions of the plasma.

Examples of potential species and corresponding optical lines monitored for potential use in yield correlations are shown in TABLE I.

TABLE I

| SPECIES | WAVELENGTH (nm) |
|---|---|
| $CF_2$ | 251.86 |
| $CF_2$ | 289.35 |
| $C_2$ | 468.88 |
| F | 685.602 |
| F | 690.246 |
| F | 703.745 |
| SiF | 440.05 |
| O | 777.417 |
| H | 656.285 |

At step 50, the plasma is monitored via the optical monitoring apparatus as shown in FIG. 1 until the ratio of F/$CF_2$ exceeds a predetermined threshold T. The threshold T is dependent upon the detector used, the species used, as well as, the optical lines which are used to monitor the plasma. If the threshold is not exceeded, then the process continues, back to step 42 until processing on the wafer is completed.

If, however, the threshold is exceeded, then a process technician monitoring the process can assume that the etch-stop phenomenon will certainly appear and thus, it would be desirable to continue processing the current lot of wafers but not to process a subsequent lot of wafers until the plasma reactor is cleaned by a process as will be described hereinafter.

TABLE II shows the different species as well as different wavelengths of emission lines which can be monitored using the particular species. It is preferred to monitor combinations of these species to determine a correlation to the onset of etch-stop. These data are collected from a Applied Materials Santa Clara Calif. Plasma Etcher Model. No. 5300 Omega HDP.

As shown in TABLE II, several combinations of spectral lines and species provide a good indicator of reactor chamber condition. The threshold values vary for different line combinations however, for different runs or lots of devices on the same plasma etcher setup, the threshold values remain generally valid. Certain combinations do not provide useful information since they provide no consistent trends or non-single valued functions. Some combinations of F/$CF_2$, yield the same results, whereas some combinations do not. In particular, certain combinations of emission lines, the 252 nm $CF_2$ line does not work with the 685 or the 690 nm F line since in each case, the lines yield a non-single valued case where the same ratio has both good and bad yields.

TABLE II

| Spectral line ratio | acceptable | threshold limit | comment |
|---|---|---|---|
| F 703/$CF_2$ 289 | yes | <0.4 | preferred |
| F 703/$CF_2$ 252 | yes | <0.7 | |
| F 685/$CF_2$ 289 | yes | <0.5 | |
| F 685/$CF_2$ 252 | no | | not single-valued |
| F 690/$CF_2$ 289 | yes | <0.15 | |
| F 690/$CF_2$ 252 | no | | not single-valued |
| F 703/$C_2$ 468 | no | | not consistent |
| $CF_2$ 289/$C_2$ 468 | yes | >0.04 | |
| F 703/SiF 440 | yes | <0.0063 | |
| $CF_2$ 289/SiF 440 | yes | <55.0 | |
| O 777/F 703 | no | | not consistent |
| O 777/CF 2289 | yes | <0.45 | |
| H 656/F 703 | no | | not consistent |
| $C_2$ 468/SiF 440 | no | | not consistent |
| H 656/$CF_2$ 289 | no | | not consistent |

We believe that chamber poisoning occurs during the etching process of the dielectric material, and as the F/$CF_2$ ratio increases, the chamber poisoning becomes sufficient to cause the etch-stop phenomenon. In particular, the inevitable over-etching of the dielectric causes some unwanted etching of the underlying conductive layers. For a metal conductive layer such as TiN/Al the presence of these metals, in particular the less volatile Al in the plasma result in plasma poisoning. By monitoring the F/$CF_2$ ratio and by not permitting the ratio to exceed the threshold value for the particular detector and emission line pair, the etch-stop phenomena can be generally avoided improving the yield of this fabrication step. Further, by employing the sea of contacts or ring of contacts approach, the amount of the dielectric that needs to be etched is minimized with concomitantly minimizes the amount of the underlying conductor which is exposed to the plasma and hence reduces contamination of the plasma.

When the threshold is approached or exceeded, the wafer processing is typically completed and then the reaction chamber is opened and cleaned in accordance with techniques furnished by the particular manufacturer of the plasma depositional reactor chamber.

A preferred cleaning technique includes removing all deposited materials from walls and supports in the deposition chamber by scraping, and cleaning all surfaces with de-ionized water and isopropyl alcohol in accordance with the directions of the manufacturer of the plasma etcher.

Having described preferred embodiments of the invention, it will now become apparent to those of skill in the art that other embodiments incorporating its concept may be used. Accordingly, it is felt that the invention should not be limited to the disclosed embodiments, but rather should be limited only by the spirit and scope of the appending claims.

What is claimed is:

1. A method to determine the onset of etch stop in an etching apparatus containing a plasma, wherein etch stop is a cessation of etching in repeated runs of etching resulting from contamination of the etching apparatus, said method comprising the steps of:

selecting a plurality of specie components in the plasma and a threshold value of a ratio of energy magnitudes of spectral lines corresponding to the plurality of specie components such that the threshold is indicative of contamination of the etching apparatus and the onset of etch stop;

monitoring electromagnetic energy in the plasma, during repeated runs of etching selected portions of dielectric, to determine the ratio of energy magnitudes of the spectral lines and continuing to etch dielectric while the ratio is less than the threshold value;

stopping said repeated runs of etching of dielectric when the ratio approaches the threshold value; and cleaning the etching apparatus containing the plasma as a result of the ratio approaching the threshold value.

2. The method of claim 1 wherein dielectric is etched to form a via to an underlying conductive layer.

3. The method of claim 2 wherein dielectric is etched to form areas for contact pads of an integrated circuit and wherein dielectric is masked by a pattern which provides a plurality of vias disposed about the periphery of the pad area to be etched in order to retard the onset of etch stop.

4. The method of claim 1 wherein the etchant is decomposed from a fluorinated hydrocarbon and the resulting specie components include fluorinated hydrocarbons.

5. The method of claim 4 wherein said etchant is F and/or $F^+$ and the resultant species are $C_xF_y$.

6. The method of claim 1 wherein the etchant is F and/or $F^+$ and the ratio of energy magnitudes is of F or $F^+$ to a component selected from the group consisting of $CF_2$, SiF, O, H, $C_2$.

7. The method of claim 1 wherein a selected emission line for each of the components of the ratio of energy magnitudes is monitored.

8. The method of claim 1 wherein the ratios of magnitudes of spectral emission lines monitored are selected from the group consisting of F (703 nm)/$CF_2$ (289 nm), F (703 nm)/$CF_2$ (252 nm), F (685 nm)/$CF_2$ (289 nm), F (690 nm)/$CF_2$ (289 nm), $CF_2$ (289 nm)/$C_2$ (468 nm), F (703 nm)/SiF (440 nm), $CF_2$ (289 nm)/SiF (440 nm), O (777 nm)/$CF_2$ (289 nm), and $C_2$ (468 nm)/SiF (440 nm) ratios where the spectral lines are given in nanometers (nm).

9. The method of claim 3 wherein said etchant is decomposed from a fluorinated hydrocarbon and the resulting specie components include fluorinated hydrocarbons.

10. The method of claim 9 wherein said etchant is F and/or $F^+$ and the resultant species are $C_xF_y$.

11. The method of claim 10 wherein the etchant is F and/or $F^+$ and the ratio of energy magnitudes is of F or $F^+$ to a component selected from the group consisting of $CF_2$, SiF, O, H, $C_2$.

12. The method of claim 9 wherein one of the ratios of energy magnitudes of spectral emission lines monitored is selected from the group consisting of F (703 nm)/$CF_2$ (289 nm), F (703 nm)/$CF_2$ (252 nm), F (685 nm)/$CF_2$ (289 nm), F (690 nm)/$CF_2$ (289 nm), $CF_2$ (289 nm)/$C_2$ (468 nm), F (703 nm)/SiF (440 nm), $CF_2$ (289 nm)/SiF (440 nm), O (777 nm)/$CF_2$ (289 nm), and $C_2$ (468 nm)/SiF (440 nm) ratios where the spectral lines are given in nanometers (nm).

13. The method of claim 2 wherein dielectric is etched to form areas for contact pads of an integrated circuit and wherein selected portions of dielectric are masked by a pattern which provides a plurality of vias disposed throughout the pad area to be etched in order to retard the onset of etch stop.

14. The method of claim 13 wherein said etchant is decomposed from a fluorinated hydrocarbon and the resulting specie components include fluorinated hydrocarbons.

15. The method of claim 14 wherein said etchant is F and/or $F^+$ and the resultant species are $C_xF_y$.

16. The method of claim 15 wherein the etchant is F and/or $F^+$ and the ratio of energy magnitudes is of F or $F^+$ to a component selected from the group consisting of $CF_2$, SiF, O, H, $C_2$.

17. The method of claim 14 wherein one of the ratios of energy magnitudes of spectral emission lines monitored is selected from the group consisting of F (703 nm)/$CF_2$ (289 nm), F (703 nm)/$CF_2$ (252 nm), F (685 nm)/$CF_2$ (289 nm), F (690 nm)/$CF_2$ (289 nm), $CF_2$ (289 nm)/$C_2$ (468 nm), F (703 nm)/SiF (440 nm), $CF_2$ (289 nm)/SiF (440 nm), O (777 nm)/$CF_2$ (289 nm), and $C_2$ (468 nm)/SiF (440 nm) ratios where the spectral lines are given in nanometers (nm).

18. A method of monitoring etching conditions in an etching apparatus containing a plasma to determine the onset of etch stop, wherein etch stop is a cessation of etching in repeated runs of etching resulting from contamination of the etching apparatus, said method comprising the steps of:

selecting a plurality of specie components in the plasma and a threshold value of a ratio of energy magnitudes of spectral lines corresponding to a plurality of specie components such that the threshold is indicative of contamination of the etching apparatus and the onset of etch stop;

etching a dielectric using said plasma containing an etchant and continuing to etch the dielectric while monitoring the electromagnetic energy in the plasma to determine a ratio of energy magnitudes of spectral lines corresponding to a pair of specie components in the plasma;

stopping etching of the dielectric when the ratio of the specie components exceeds the threshold value; and cleaning the etching apparatus containing the plasma as a result of the ratio exceeding the threshold value to remove residual materials from the apparatus.

19. A method to determine the onset of etch stop in an etching apparatus containing a plasma, comprising the steps of:

etching a dielectric to form areas for contact pads of an integrated circuit and wherein said dielectric is masked by a pattern which provides a plurality of vias disposed about the periphery of the pad area to be etched to retard the onset of etch stop;

monitoring electromagnetic energy in the plasma to determine a ratio of energy magnitudes of spectral lines corresponding to a pair of specie components in the plasma and continuing to etch said dielectric while the ratio of specie components is less than a threshold value;

stopping etching of dielectric when the ratio of the specie components approaches the threshold value; and cleaning the etching apparatus containing the plasma as a result of the ratio approaching the threshold value.

* * * * *